(12) United States Patent
Pyon (10) Patent No.: US 10,340,324 B2
(45) Date of Patent: Jul. 2, 2019

(54) ORGANIC LIGHT-EMITTING DIODE DISPLAY

(71) Applicant: Samsung Display Co., Ltd., Yongin-si, Gyeonggi-do (KR)

(72) Inventor: Chang Soo Pyon, Seongnam-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 509 days.

(21) Appl. No.: 15/138,054

(22) Filed: Apr. 25, 2016

(65) Prior Publication Data

US 2016/0322449 A1 Nov. 3, 2016

(30) Foreign Application Priority Data

Apr. 28, 2015 (KR) .................. 10-2015-0059995

(51) Int. Cl.
*H01L 27/32* (2006.01)
*G09G 3/3233* (2016.01)

(52) U.S. Cl.
CPC ....... *H01L 27/3276* (2013.01); *G09G 3/3233* (2013.01); *H01L 27/3262* (2013.01); *H01L 27/3265* (2013.01); *G09G 2300/0426* (2013.01); *G09G 2300/0814* (2013.01); *G09G 2300/0819* (2013.01); *G09G 2300/0852* (2013.01); *G09G 2300/0861* (2013.01); *G09G 2300/0866* (2013.01)

(58) Field of Classification Search
None
See application file for complete search history.

(56) References Cited

U.S. PATENT DOCUMENTS

2003/0214006 A1* 11/2003 Nakamura ........ G02F 1/136286
257/448

FOREIGN PATENT DOCUMENTS

| KR | 10-1223725 B1 | 1/2013 |
|---|---|---|
| KR | 10-2013-0110987 A | 10/2013 |
| KR | 10-2014-0014693 A | 2/2014 |
| KR | 10-2014-0018623 A | 2/2014 |

* cited by examiner

*Primary Examiner* — Michelle Mandala
(74) *Attorney, Agent, or Firm* — F. Chau & Associates (57) ABSTRACT

An organic light-emitting diode (OLED) display is disclosed. In one aspect, the display includes a substrate, a scan line formed over the substrate and configured to provide a scan signal, and a data line crossing the scan line and configured to provide a data voltage. The display also includes a driving voltage line crossing the scan line and configured to provide a driving voltage, a switching transistor electrically connected to the scan line and the data line, and a driving transistor electrically connected to the switching transistor and including a driving gate electrode and a driving channel overlapping each other in the depth dimension of the display. A first storage capacitor overlaps the driving channel in the depth dimension and includes a portion of the driving voltage line. A second storage capacitor is separated from the first storage capacitor and overlaps the portion of the driving voltage line.

20 Claims, 8 Drawing Sheets

ORGANIC LIGHT-EMITTING DIODE DISPLAY

CROSS-REFERENCE TO RELATED APPLICATION

This application claims priority to and the benefit of Korean Patent Application No. 10-2015-0059995 filed in the Korean Intellectual Property Office on Apr. 28, 2015, the entire contents of which are incorporated herein by reference.

BACKGROUND

Field

The described technology generally relates to an organic light-emitting diode display.

Description of the Related Technology

An organic light-emitting diode (OLED) includes two electrodes and an interposed organic light emitting layer. Electrons injected from a cathode electrode and holes injected from an anode electrode are bonded to each other in the organic light emitting layer to form excitons. Light is emitted when the excitons discharge energy.

OLED displays include a matrix of pixels including an OLED formed of the cathode, the anode, and the organic light emitting layer. A plurality of thin film transistors and capacitors for driving the OLED are formed in each pixel, or pixel circuit. The transistors generally include a switching transistor and a driving transistor.

The capacitor includes a storage capacitor overlapping the driving transistor, and since the size of the pixel decreases with increased display resolution, storage capacitance of the storage capacitor also decreases.

The above information disclosed in this Background section is only to enhance the understanding of the background of the disclosure, and therefore it can contain information that does not form the prior art that is already known in this country to a person of ordinary skill in the art.

SUMMARY OF CERTAIN INVENTIVE ASPECTS

One inventive aspect relates to an OLED display that can maximize storage capacitance in a high resolution structure.

Another aspect is an OLED display that includes a substrate; a plurality of scan lines formed on the substrate and transmitting a scan signal; a plurality of data lines crossing the plurality of scan lines and transmitting a data voltage; a plurality of driving voltage lines crossing the plurality of scan lines and transmitting a driving voltage; a switching transistor connected to the plurality of scan lines and the plurality of data lines; a driving transistor connected to the switching transistor and including a driving gate electrode and a driving channel overlapping each other; a first storage capacitor overlapping the driving channel and including a portion of the driving voltage line; a second storage capacitor separated from the first storage capacitor and overlapping a portion of the driving voltage line; and an OLED electrically connected to the driving transistor.

The first storage capacitor can include a first lower storage electrode as a driving gate electrode, and a first upper storage electrode that overlaps the first lower storage electrode and is a portion of the driving voltage line.

The second storage capacitor can include a second lower storage electrode formed with the same layer as the driving channel, and a second upper storage electrode overlapping the second lower storage electrode and formed in the same layer as the first lower storage electrode.

The first lower storage electrode and the second upper storage electrode can be separated from each other.

The first lower storage electrode can be formed in the same layer as the scan line.

A storage connecting member formed in the same layer as the driving voltage line and connecting the first lower storage electrode and the second lower storage electrode to each other can be further included.

The OLED can include a pixel electrode electrically connected to the driving transistor, an organic emission layer formed on the pixel electrode, and a common electrode formed on the organic emission layer, and an initialization voltage line formed in the same layer as the pixel electrode and transmitting an initialization voltage initializing the driving transistor, and an initialization connecting member connecting the initialization voltage line and the second upper storage electrode to each other can be further included.

A gate insulating layer formed on the substrate, and an interlayer insulating layer covering the first lower storage electrode and the second upper storage electrode formed on the gate insulating layer can be further included, and the storage connecting member and the initialization connecting member can be formed on the interlayer insulating layer.

The storage connecting member can further include a contact hole connecting the first lower storage electrode and the second lower storage electrode to each other.

A thickness of the gate insulating layer can be thinner than the thickness of the interlayer insulating layer.

The driving channel can be formed on the substrate and the driving channel can be a curved plane.

The driving voltage line can include a first driving voltage line parallel to the data line and a second driving voltage line crossing the data line, and the first driving voltage line can be formed in the same layer as the data line, and the second driving voltage line can be formed in the same layer as the scan line.

The first storage capacitor and the second storage capacitor can be formed inside an imaginary rectangle shape formed by crossing the plurality of scan lines and the plurality of data lines.

The driving transistor can further include a driving source electrode and a driving drain electrode positioned at both sides of the driving channel.

A compensation transistor turned on depending on a scan signal, formed to compensate a threshold voltage of the driving transistor, and connected to the driving drain electrode, and a driving connecting member connecting a compensation drain electrode of the compensation transistor and the driving gate electrode can be further included.

Another aspect is an organic light-emitting diode (OLED) display, comprising: a substrate; a scan line formed over the substrate and configured to provide a scan signal; a data line crossing the scan line and configured to provide a data voltage; a driving voltage line crossing the scan line and configured to provide a driving voltage; a switching transistor electrically connected to the scan line and the data line; a driving transistor electrically connected to the switching transistor and including a driving gate electrode and a driving channel overlapping each other in the depth dimension of the OLED display; a first storage capacitor overlapping the driving channel in the depth dimension and including a portion of the driving voltage line; a second storage capacitor separated from the first storage capacitor and overlapping the portion of the driving voltage line in the depth dimension; and an OLED electrically connected to the driving transistor.

In the above OLED display, the first storage capacitor includes i) a first lower storage electrode including the driving gate electrode and ii) a first upper storage electrode overlapping the first lower storage electrode and including the portion of the driving voltage line.

In the above OLED display, the second storage capacitor includes i) a second lower storage electrode formed on the same layer as the driving channel and ii) a second upper storage electrode overlapping the second lower storage electrode in the depth dimension and formed on the same layer as the first lower storage electrode.

In the above OLED display, the first lower storage electrode and the second upper storage electrode are separated from each other.

In the above OLED display, the first lower storage electrode is formed on the same layer as the scan line.

The above OLED display further comprises a storage connector formed on the same layer as the driving voltage line and configured to electrically connect the first lower storage electrode to the second lower storage electrode.

In the above OLED display, the OLED includes a pixel electrode electrically connected to the driving transistor, an organic emission layer formed over the pixel electrode, and a common electrode formed over the organic emission layer, wherein the OLED display further comprises: an initialization voltage line formed on the same layer as the pixel electrode and configured to provide an initialization voltage to initialize the driving transistor; and an initialization connector configured to electrically connect the initialization voltage line to the second upper storage electrode.

The above OLED display further comprises: a gate insulating layer formed over the substrate; and an interlayer insulating layer at least partially covering the first lower storage electrode and the second upper storage electrode formed over the gate insulating layer, wherein the storage connector and the initialization connector are formed over the interlayer insulating layer.

In the above OLED display, the storage has a contact hole configured to electrically connect the first lower storage electrode to the second lower storage electrode.

In the above OLED display, the gate insulating layer is thinner than the interlayer insulating layer.

In the above OLED display, the driving channel is formed over the substrate, wherein the driving channel is non-linear.

In the above OLED display, the driving voltage line includes i) a first driving voltage line substantially parallel to the data line and ii) a second driving voltage line crossing the data line, wherein the first driving voltage line is formed on the same layer as the data line, and wherein the second driving voltage line is formed on the same layer as the scan line.

In the above OLED display, the first and second storage capacitors are spaced apart from each other within a pixel of the OLED display.

In the above OLED display, the driving transistor further includes a driving source electrode and a driving drain electrode located at opposing ends of the driving channel.

The above OLED display further comprises: a compensation transistor electrically connected to the driving drain electrode and configured to be turned on based on a scan signal so as to compensate a threshold voltage of the driving transistor; and a driving connector configured to electrically connect a compensation drain electrode of the compensation transistor to the driving gate electrode.

Another aspect is an organic light-emitting diode (OLED) display comprising: a substrate; a data line formed over the substrate and configured to provide a data voltage; a driving voltage line formed adjacent to the data line and configured to provide a driving voltage; a first storage capacitor including a first upper storage electrode including a portion of the driving voltage line; and a second storage capacitor electrically separated from the first storage capacitor and overlapping the portion of the driving voltage line in the depth dimension of the OLED display.

The above OLED display further comprises a driving transistor including a driving gate electrode and a driving channel overlapping each other in the depth dimension, wherein the first storage capacitor overlaps the driving transistor in the depth dimension.

In the above OLED display, the first storage capacitor further includes a first lower storage electrode including the driving gate electrode, wherein the second storage capacitor includes i) a second lower storage electrode formed on the same layer as the driving channel and ii) a second upper storage electrode overlapping the second lower storage electrode in the depth dimension and formed on the same layer as the first lower storage electrode.

The above OLED display further comprises an OLED including a pixel electrode formed over the first upper and lower storage electrodes and the second upper and lower storage electrodes.

In the above OLED display, the first and second capacitors partially overlap each other.

According to at least one of the disclosed embodiments, the first storage capacitor and the second storage capacitor are formed in one pixel, thereby maximizing the storage capacitance.

Also, the first upper storage electrode is formed in the same layer and of the same material as the driving voltage line and the data line, thereby reducing at least one mask.

DETAILED DESCRIPTION OF CERTAIN INVENTIVE EMBODIMENTS

The present disclosure will be described more fully hereinafter with reference to the accompanying drawings, in which exemplary embodiments of the disclosure are shown. As those skilled in the art would realize, the described embodiments can be modified in various different ways, all without departing from the spirit or scope of the present disclosure.

In order to clearly describe the present disclosure, portions that are not connected with the description will be omitted. Like reference numerals designate like elements throughout the specification.

In addition, the size and thickness of each configuration shown in the drawings are arbitrarily shown for understanding and ease of description, but the present disclosure is not necessarily limited thereto. In the drawings, the thickness of layers, films, panels, regions, etc., are exaggerated for clarity. In the drawings, the thickness of layers, films, panels, regions, etc., are also exaggerated for ease of description.

In addition, unless explicitly described to the contrary, the word "comprise" and variations such as "comprises" or "comprising", will be understood to imply the inclusion of stated elements but not the exclusion of any other elements. Further, it will be understood that when an element such as a layer, film, region, or substrate is referred to as being "on" another element, it can be directly on the other element or intervening elements can also be present. Further, in the specification, the word "on" means positioning on or below the object portion, but does not necessarily mean positioning on the upper side of the object portion based on a gravitational direction.

Further, in the specification, the word "in plan view" means when an object portion is viewed from above, and the word "in cross section" means when a cross section taken by vertically cutting an object portion is viewed from the side.

Further, the number of thin film transistors (TFTs) and capacitors is not limited to the number illustrated in the accompanying drawings and an OLED display can be formed in various structures in which one pixel can include a plurality of transistors and at least one capacitor and is further provided with a separate wiring or does not include the existing wirings. Here, a pixel means a minimum unit which displays an image, and the organic light emitting device displays an image through a plurality of pixels. In this disclosure, the term "substantially" includes the meanings of completely, almost completely or to any significant degree under some applications and in accordance with those skilled in the art. The term "connected" can include an electrical connection.

Hereinafter, an OLED display according to an exemplary embodiment of the present disclosure will be described with reference to the accompanying drawings.

Figure 1:
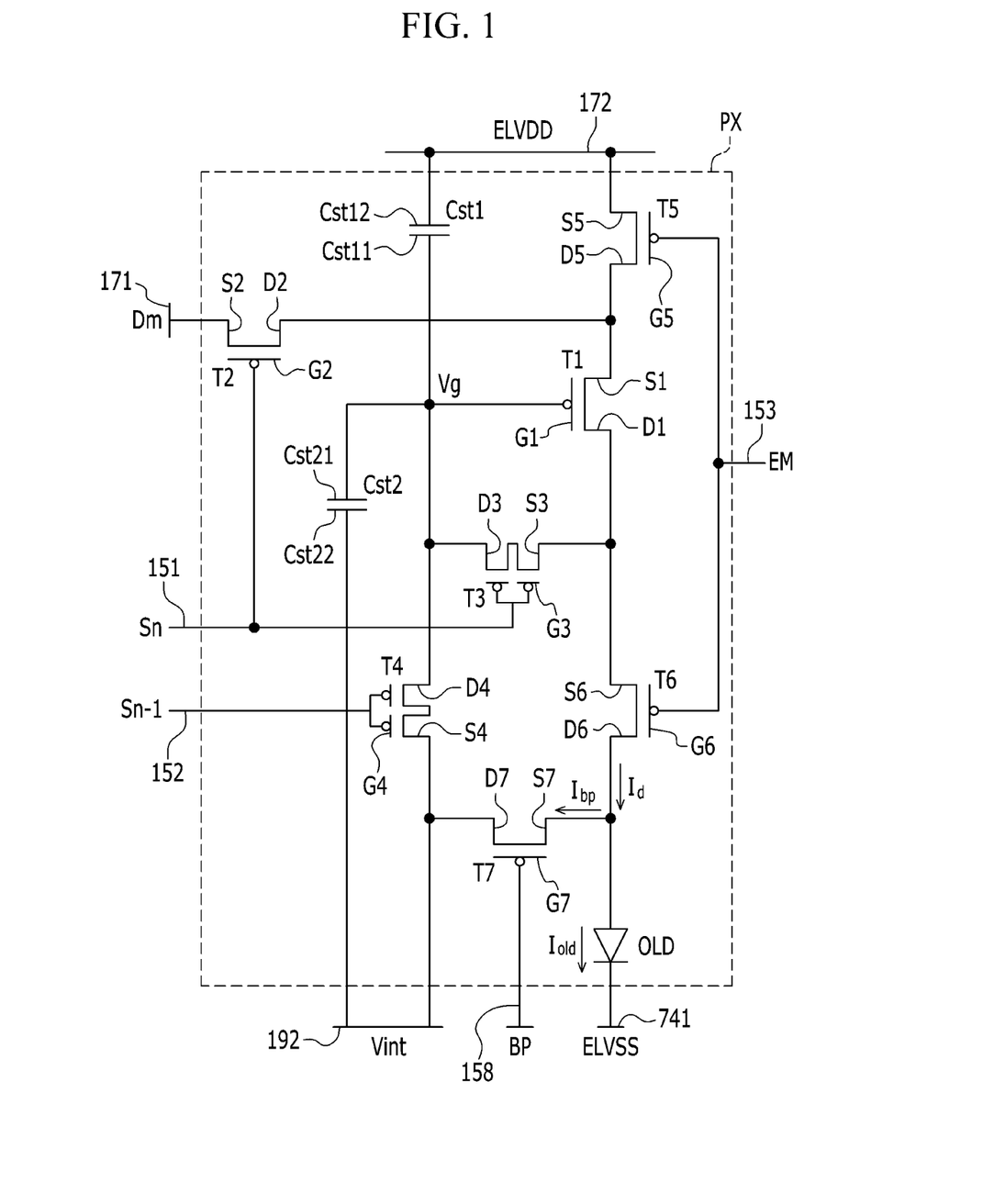
FIG. 1 is an equivalent circuit diagram of a pixel of an OLED display according to an exemplary embodiment of the present disclosure.

FIG. 1 is an equivalent circuit diagram of a pixel of an OLED display according to an exemplary embodiment of the present disclosure.

As shown in FIG. 1, the OLED display includes a plurality of signal lines 151, 152, 153, 158, 171, 172, and 192, and a plurality of pixels PX arranged in a matrix and connected to the plurality of signal lines.

One pixel PX includes a plurality of transistors T1, T2, T3, T4, T5, T6, and T7, a first storage capacitor Cst1, a second storage capacitor Cst2, and an OLED (OLD) that are connected to the signal lines 151, 152, 153, 158, 171, 172, and 192.

The transistors T1, T2, T3, T4, T5, T6, and T7 include a driving transistor T1, a switching transistor T2, a compensation transistor T3, an initialization transistor T4, an operation control transistor T5, a light emission control transistor T6, and a bypass transistor T7.

The signal lines 151, 152, 153, 158, 171, 172, and 192 include a scan line 151 which transfers a scan signal Sn, a front end scan line 152 which transfers a front end scan signal Sn-1 to the initialization transistor T4, a light emission control line 153 which transfers a light emitting control signal EM to the operation control transistor T5 and the light emission control transistor T6, a bypass control layer 158 which transfers a bypass signal BP to the bypass transistor T7, a data line 171 which intersects the scan line 151 and transfers a data signal Dm, a driving voltage line 172 which transfers a driving voltage ELVDD and is formed approximately parallel to the data line 171, and an initialization voltage line 192 which transfers an initialization voltage Vint for initializing the driving transistor T1.

A gate electrode G1 of the driving transistor T1 is connected to one terminal Cst1 of the storage capacitor Cst, a source electrode S1 of the driving transistor T1 is connected to the driving voltage line 172 via the operation control transistor T5, and a drain electrode D1 of the driving transistor T1 is electrically connected to an anode of the OLED (OLD) via the light emission control transistor T6. The driving transistor T1 receives the data signal Dm depending on a switching operation of the switching transistor T2 to supply a driving current Id to the OLED (OLD).

A gate electrode G2 of the switching transistor T2 is connected to the scan line 151, a source electrode S2 of the switching transistor T2 is connected to the data line 171, and a drain electrode D2 of the switching transistor T2 is connected to the driving voltage line 172 via the operation control transistor T5, while being connected to the source electrode S1 of the driving transistor T1. The switching transistor T2 is turned on depending on the scan signal Sn which is transferred through the scan line 151 to perform a switching operation of transferring the data signal Dm transferred to the data line 171 to the source electrode S1 of the driving transistor T1.

A gate electrode G3 of the compensation transistor T3 is connected to the scan line 151, a source electrode S3 of the compensation transistor T3 is connected to the anode of the OLED (OLD) via the light emission transistor T6 while being connected to the drain electrode D1 of the driving transistor T1, and a drain electrode D3 of the compensation transistor T3 is connected to a drain electrode D4 of the initialization transistor T4, one terminal Cst1 of the storage capacitor Cst, and the gate electrode G1 of the driving transistor T1. The compensation transistor T3 is turned on depending on the scan signal Sn which is transferred through the scan line 151 to connect the gate electrode G1 and the drain electrode D1 of the driving transistor T1 so as to diode-connect the driving transistor T1.

A gate electrode G4 of the transistor T4 is connected to the front end scan line 152, the source electrode S4 of the initialization transistor T4 is connected to the initialization voltage line 192, and the drain electrode D4 of the initialization transistor T4 is connected to one terminal Cst11 of the first storage capacitor Cst1 via both the drain electrode D3 of the compensation transistor T3 and the gate electrode G1 of the driving transistor T1. The initialization transistor T4 is turned on depending on the front end scan signal Sn-1, which is transferred through the front end scan line 152 to transfer the initialization voltage Vint to the gate electrode G1 of the driving transistor T1 so as to perform the initialization operation, which initializes a gate voltage Vg of the gate electrode G1 of the driving transistor T1. In this case, the compensation transistor T3 and the initialization transistor T4 are configured of a transistor having a dual gate structure to cut off current leakage.

A gate electrode G5 of the operation control transistor T5 is connected to the light emission control line 153, the source electrode S5 of the operation control transistor T5 is connected to the driving voltage line 172, and the drain electrode D5 of the operation control transistor T5 is connected to the source electrode S1 of the driving transistor T1 and the drain electrode S2 of the switching transistor T2.

A gate electrode G6 of the light emission transistor T6 is connected to the light emission control line 153, a source electrode S6 of the light emission transistor T6 is connected to the drain electrode D1 of the driving transistor T1 and the source electrode S3 of the compensation transistor T3, and a drain electrode D6 of the light emission transistor T6 is electrically connected to the anode of the OLED (OLD). The operation control transistor T5 and the light emission control transistor T6 are simultaneously (or concurrently) turned on depending on the light emission control signal EM, which is transferred through the light emission control line 153, and thus the driving voltage ELVDD is compensated by the diode-connected driving transistor T1 and then is transferred to the OLED (OLD).

A gate electrode G7 of the bypass transistor T7 is connected to the bypass control line 158, a source electrode S7 of the bypass transistor T7 is connected to both the drain electrode D6 of the light emission control transistor T6 and the anode of the OLED (OLD), and a drain electrode D7 of the bypass transistor T7 is connected to both the initialization voltage line 192 and the source electrode S4 of the initialization transistor T4.

The other terminal Cst12 of the capacitor Cst1 is connected to the driving voltage line 172 and a cathode of the OLED (OLD) is connected to the common voltage line 741 through which a common voltage ELVSS is transferred.

One end Cst21 of the second storage capacitor Cst2 is connected to both the gate electrode G1 of the driving transistor T1 and one end Cst11 of the first storage capacitor Cst1, and the other end Cst22 of the second storage capacitor Cst2 is connected to the initialization voltage line 192.

Meanwhile, in the exemplary embodiment of the present disclosure, the seven-transistor and two-capacitor structure including the bypass transistor T7 is illustrated, but the present disclosure is not limited thereto, and the number of transistors and the number of capacitors can vary.

Hereinafter, a detailed operation process of one pixel of the OLED display according to the exemplary embodiment of the present disclosure will be described in detail with reference to FIG. 2.

Figure 2:
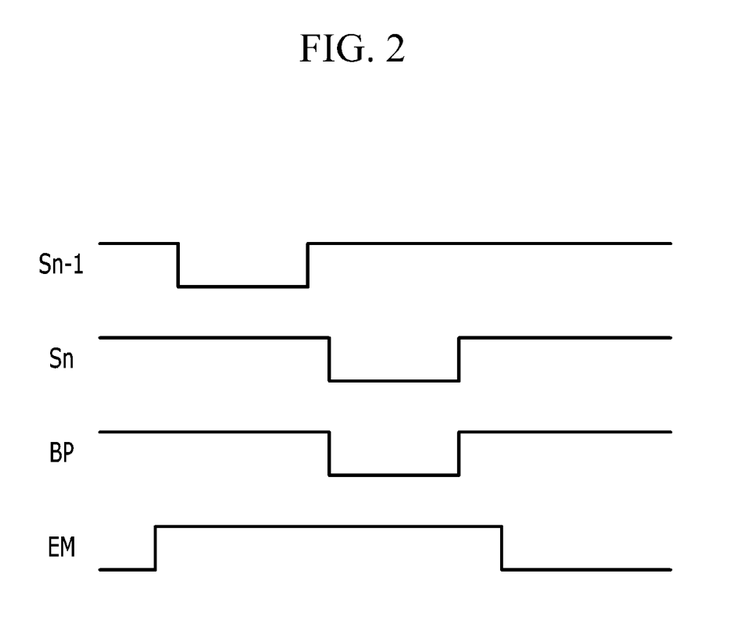
FIG. 2 is a timing diagram of a signal applied to a pixel of an OLED display according to an exemplary embodiment of the present disclosure.

FIG. 2 is a timing diagram of a signal applied to a pixel of an OLED display according to an exemplary embodiment of the present disclosure.

As illustrated in FIG. 2, the previous scan signal Sn-1 of a low level is supplied through the previous scan line 152 for an initialization period. Next, the initialization transistor T4 is turned on depending on the low-level front end scan signal Sn-1, the initialization voltage Vint is connected to the gate electrode G1 of the driving transistor T1 from the initialization voltage line 192 through the initialization transistor T4, and the driving transistor T1 is initialized by the initialization voltage Vint.

Next, the low-level scan signal Sn is supplied through the scan line 151 for a data programming period. Next, the switching transistor T2 and the compensation transistor T3 are turned on depending on the low-level scan signal Sn. In this case, the driving transistor T1 is diode-connected by the turned on compensation transistor T3 and is forward biased.

Next, a compensation voltage Dm+Vth (Vth is a negative value) which is reduced by as much as a threshold voltage (Vth) of the driving transistor T1 from the data signal Dm supplied from the data line 171 is applied to the gate electrode G1 of the driving transistor T1. That is, the gate voltage Vg which is applied to the gate electrode G1 of the driving transistor T1 is the compensation voltage Dm+Vth.

The driving voltage ELVDD and the compensation voltage Dm+Vth is applied to both terminals of the storage capacitor Cst and a charge corresponding to the difference in voltage between both terminals of the storage capacitor Cst is stored in the first storage capacitor Cst1.

Next, the light control signal EM supplied from the light emission control line 153 is changed from a high level to a low level for a light emission period. Next, the operation control transistor T5 and the light control transistor T6 are turned on by the low-level light emission control signal Em for the light emission period.

Next, a driving current Id corresponding to a voltage difference between the gate voltage Vg of the gate electrode G1 of the driving transistor T1 and the driving voltage ELVDD is generated and the driving current Id is supplied to the OLED (OLD) through the light emission control transistor T6. A driving gate-source voltage Vgs of the driving transistor T1 is maintained at '(Dm+Vth)−ELVDD' by the storage capacitor Cst for the light emission period and depending on a current-voltage relationship of the driving transistor T1, the driving current Id is proportional to a square '(Dm−ELVDD)$^2$' of a value obtained by subtracting the threshold voltage from the driving gate-source voltage Vgs. Therefore, the driving current Id is determined independent of the threshold voltage Vth of the driving transistor T1.

In this case, the bypass transistor T7 receives a bypass signal BP from the bypass control line 158. Accordingly, the driving current Id is partially discharged through the bypass transistor T7 as a bypass current Ibp.

When the OLED (OLD) emits light even though a minimum current of the driving transistor T1 displaying a black image flows as a driving current, the black image is not properly displayed. Therefore, the bypass transistor T7 can disperse some of the minimum current of the driving transistor T1 to current paths other than a current path to the OLED as the bypass current Ibp. Here, the minimum current of the driving transistor T1 means a current under the condition that the driving gate-source voltage Vgs of the driving transistor T1 is smaller than the threshold voltage Vth, and thus the driving transistor T1 is turned off. The minimum driving current (e.g., a current which is equal to or less than about 10 pA) under the condition that the driving transistor T1 is turned off is transferred to the OLED (OLD) and is represented by an image of black luminance. When the minimum driving current representing the black image flows, the effects of the bypass transfer of the bypass current Ibp is large, but when a large driving current representing an image like a general image or a white image flows, an effect of the bypass current Ibp can be minimal. Therefore, when the driving current representing the black image flows, a light emitting current Iold of the OLED (OLD), which is reduced by as much as a current amount of the bypass current Ibp which exits from the driving current Id through the bypass transistor T7, has a minimum current amount is at a level to certainly represent the black image. Therefore, the accurate black luminance image is achieved by using the bypass transistor T7 to improve a contrast ratio. In FIG. 2, the bypass signal BP is the same as the previous scan signal Sn-1, but is not necessarily limited thereto.

Next, the detailed structure of the outermost pixel PX2 among the plurality of pixels of the OLED display illustrated in FIG. 1 and FIG. 2 will be described in detail with reference to FIG. 3, FIG. 4, FIG. 5, FIG. 6, and FIG. 7.

Figure 3:
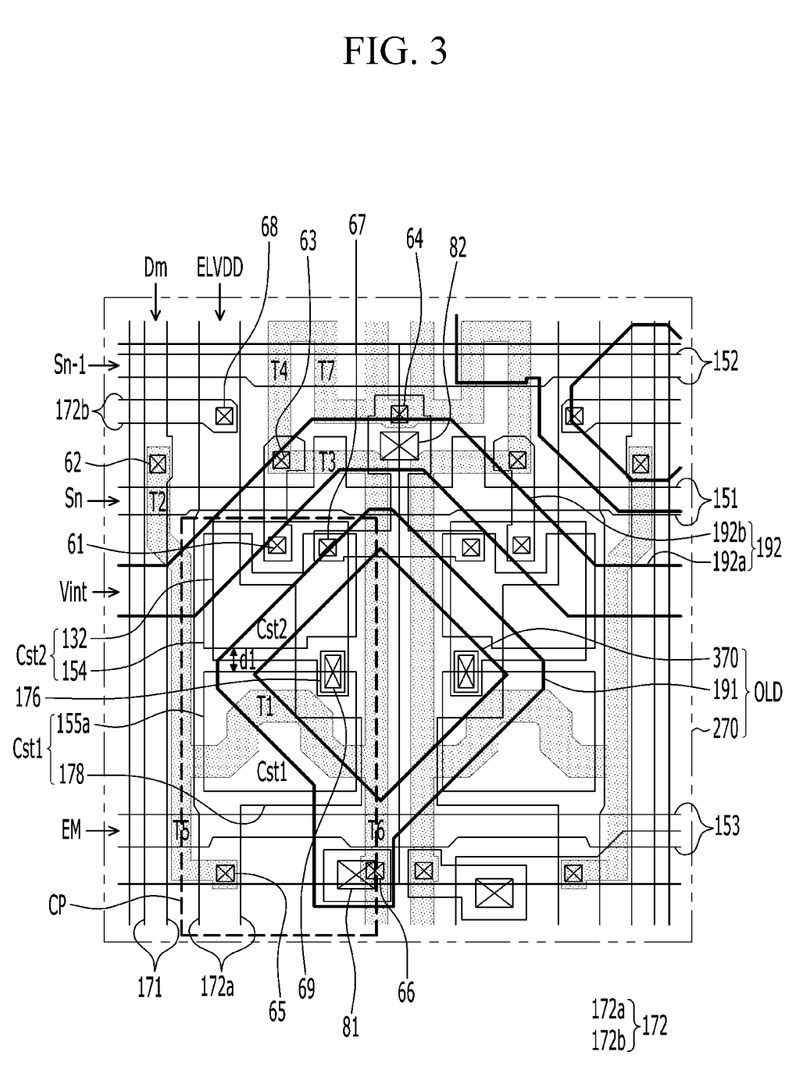
FIG. 3 is a schematic view of a plurality of transistors and capacitors of an OLED display according to an exemplary embodiment of the present disclosure.
Figure 4:
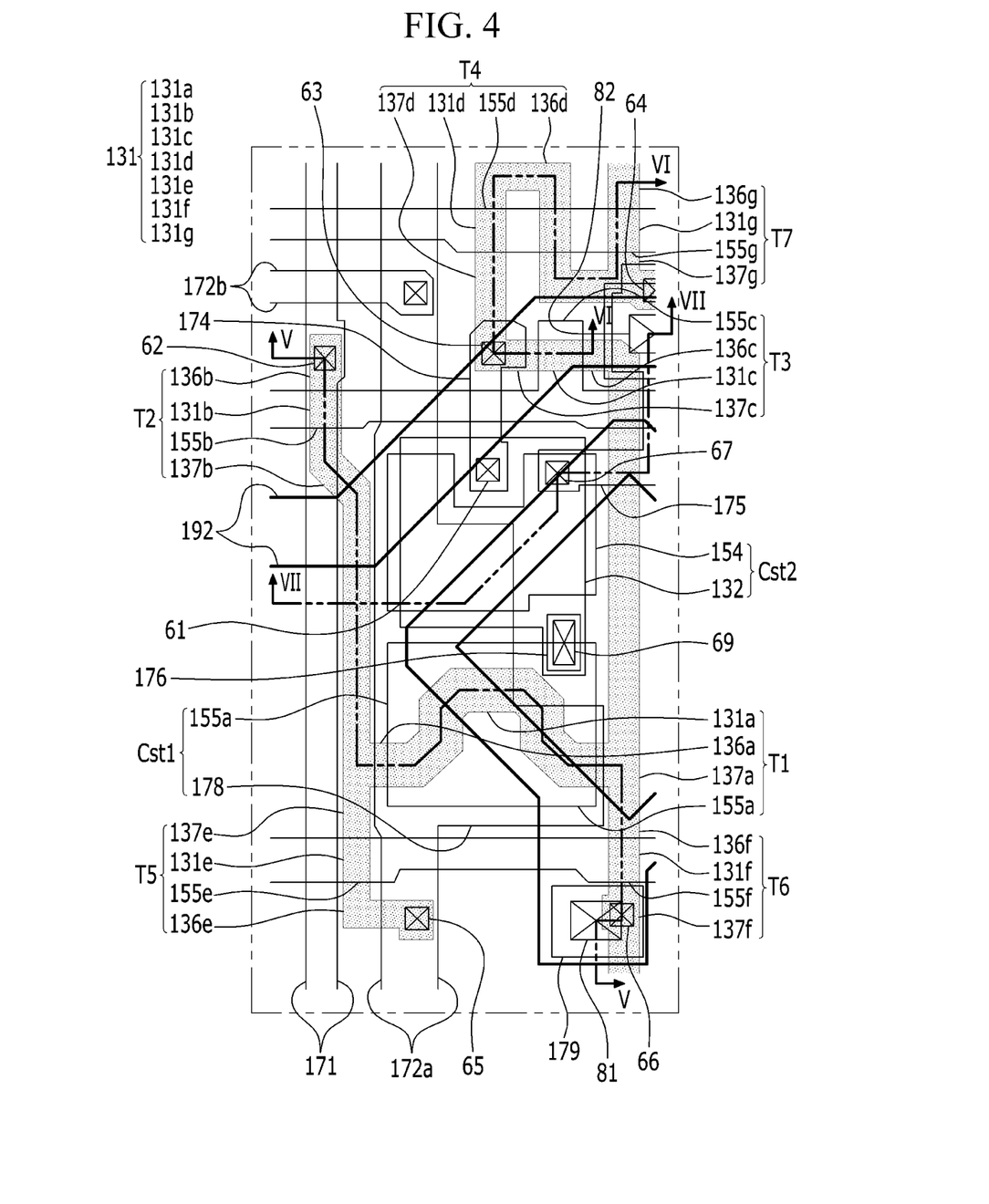
FIG. 4 is a detailed layout view of FIG. 3.
Figure 5:
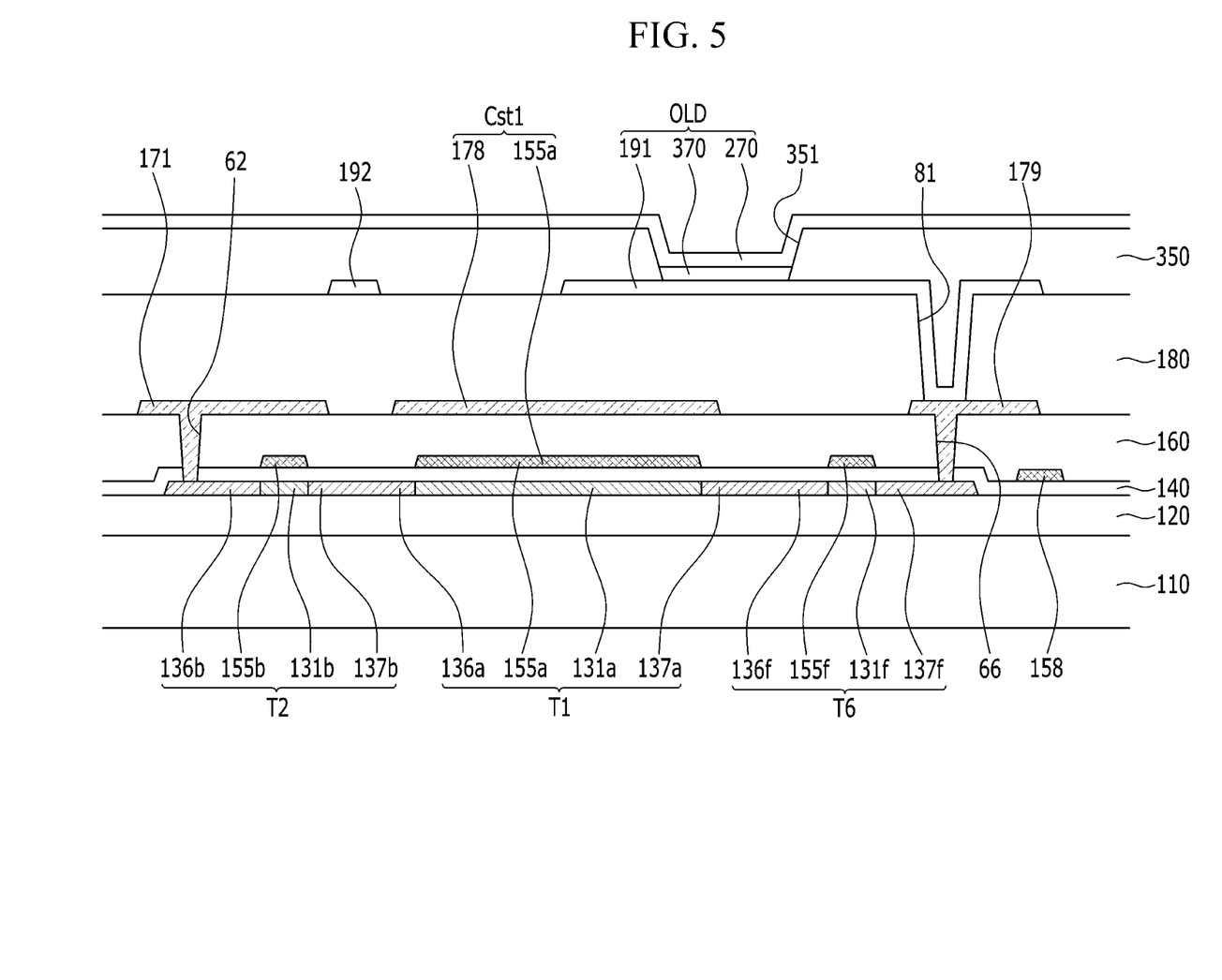
FIG. 5 is a cross-sectional view of the OLED display of FIG. 4 taken along line V-V.
Figure 6:
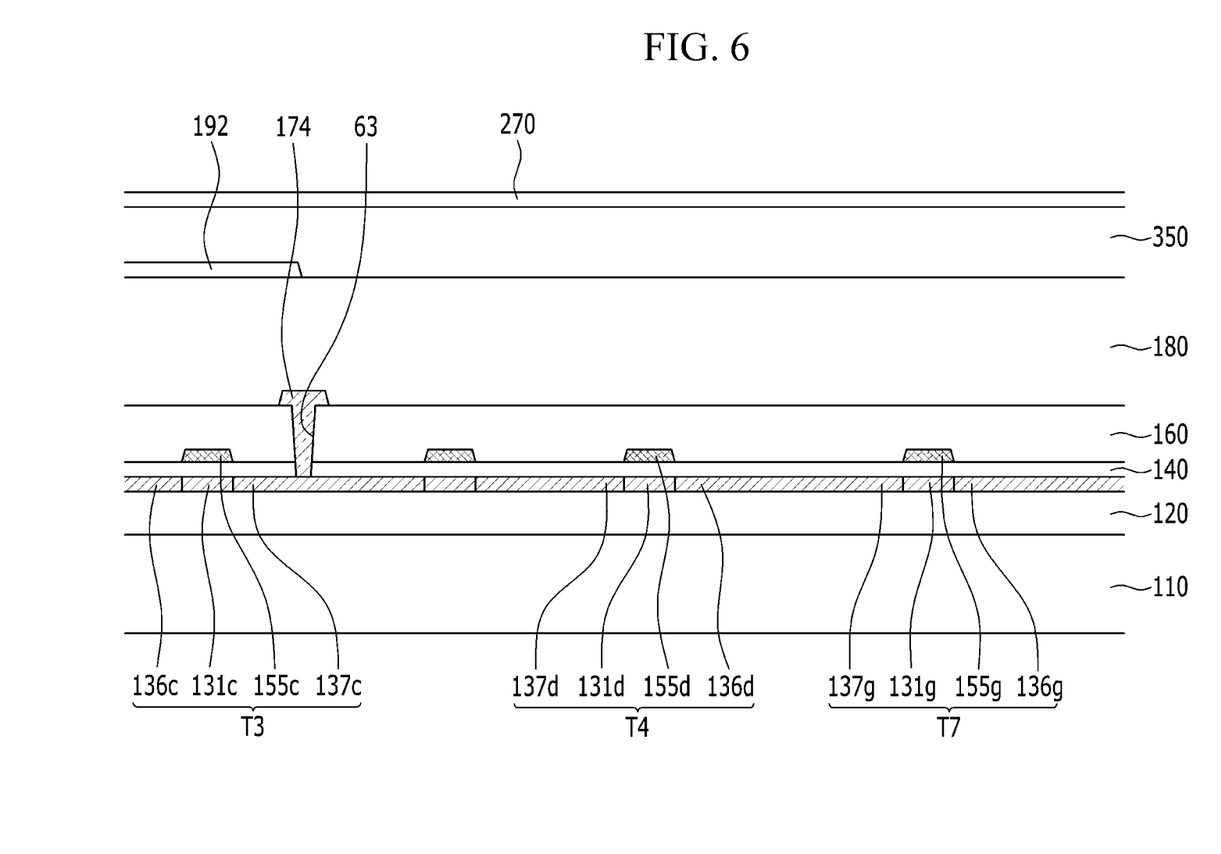
FIG. 6 is a cross-sectional view of the OLED display of FIG. 4 taken along line VI-VI.
Figure 7:
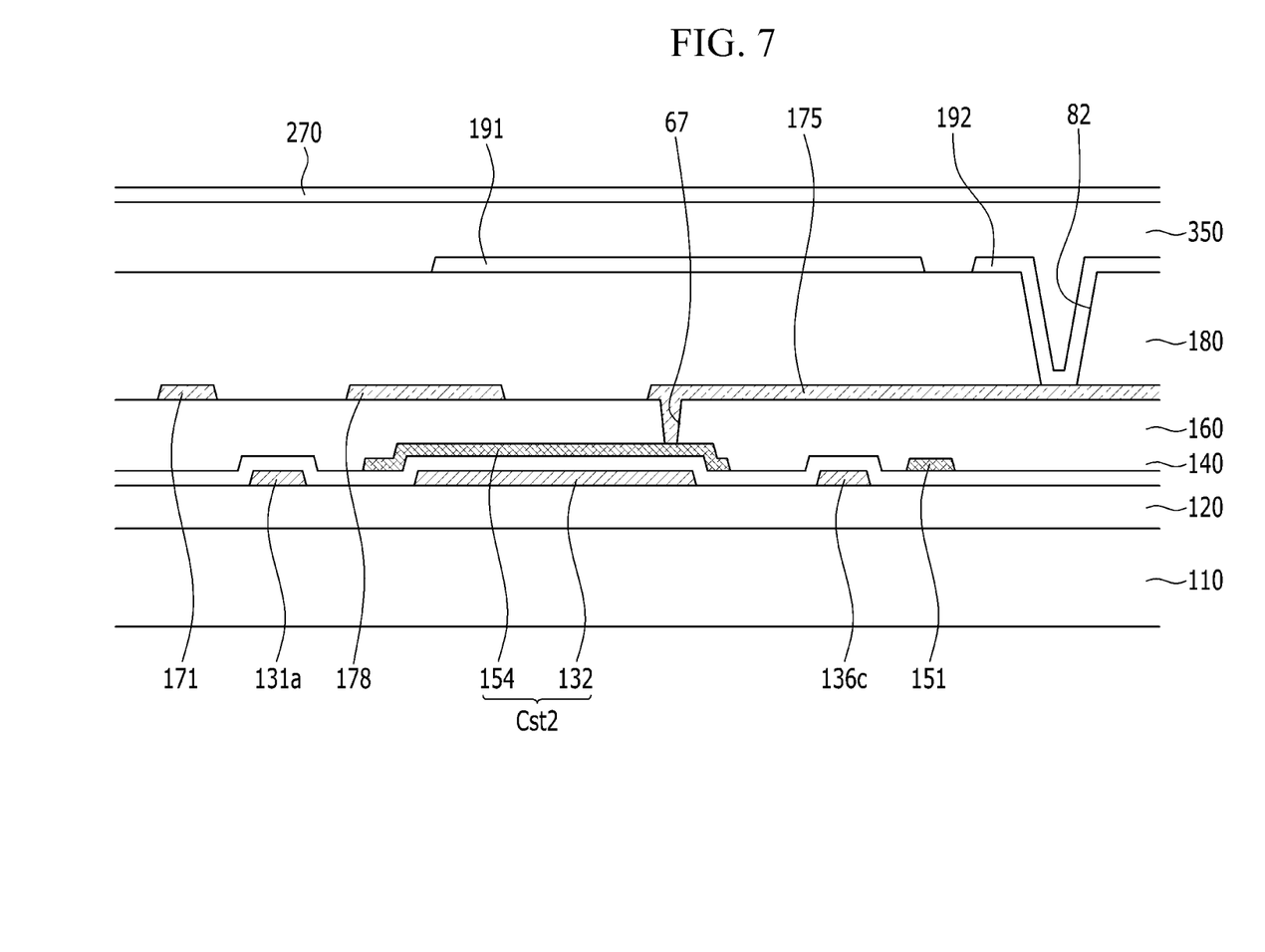
FIG. 7 is a cross-sectional view of the OLED display of FIG. 4 taken along line VII-VII.

FIG. 3 is a schematic view of a plurality of transistors and capacitors of an OLED display according to an exemplary embodiment of the present disclosure. FIG. 4 is a detailed layout view of FIG. 3. FIG. 5 is a cross-sectional view of the OLED display of FIG. 4 taken along line V-V. FIG. 6 is a cross-sectional view of the OLED display of FIG. 4 taken along line VI-VI. FIG. 7 is a cross-sectional view of the OLED display of FIG. 4 taken along line VII-VII.

Hereinafter, the detailed plane structure of the OLED display according to the exemplary embodiment of the present disclosure will first be described with reference to FIG. 3 and FIG. 4, and the detailed section structure will be described with reference to FIG. 5, FIG. 6, and FIG. 7.

As shown in FIG. 3 and FIG. 4, the OLED display according to an exemplary embodiment of the present disclosure includes a scan line 151, a previous scan line 152, an emission control line 153, and a bypass control line 158, which respectively transmit a scan signal Sn, a previous scan signal Sn-1, an emission control signal EM, and a bypass signal BP to the pixel PX and are formed along a row direction. A data line 171 and a driving voltage line 172, which intersect the scan line 151, the previous scan line 152, the light emission control line 153, and the bypass control line 158 and apply the data signal Dm and the driving voltage ELVDD to the pixel 1, are included. The driving voltage line 172 includes a first driving voltage line 172a parallel to the data line 171 and a second driving voltage line 172b parallel to the scan line 151. The first driving voltage line 172a and the second driving voltage line 172b are connected through the contact hole 68. Accordingly, compared to the case in which the first driving voltage line 172a is only formed to extend in a vertical direction to transmit the driving voltage, an exemplary embodiment of the present disclosure connects the first driving voltage line 172a elongated in a vertical direction and the second driving voltage line 172b elongated in a horizontal direction through the contact hole 68 to be a mesh structure, thereby minimizing the voltage drop of the driving voltage line 172.

The initialization voltage Vint is transferred from the initialization voltage line 192 to the compensation transistor T3 via the initialization transistor T4. The initialization voltage line 192 alternately includes a straight portion and an oblique portion. The straight portion 192a is formed to be parallel to the scan line 121 and the oblique portion 192b extends at a predetermined angle to the straight portion 192a.

Further, the pixel PX is provided with the driving transistor T1, the switching transistor T2, the compensation transistor T3, the initialization transistor T4, the operation control transistor T5, the light emission control transistor T6, the bypass transistor T7, the first storage capacitor Cst1, the second storage capacitor Cst2, and the OLED (OLD).

The OLED (OLD) includes a pixel electrode 191, an organic emission layer 370, and a common electrode 270. In this case, the compensation transistor T3 and the initialization transistor T4 are configured of a transistor having a dual gate structure to cut off current leakage.

Each channel of the driving transistor T1, the switching transistor T2, the compensation transistor T3, the initialization transistor T4, the operation control transistor T5, the light emission control transistor T6, and the bypass transistor T7 is formed inside one connected semiconductor 130, which can be bent in various shapes. The semiconductor 130 can be formed of polysilicon or an oxide semiconductor. The oxide semiconductor can include one of titanium (Ti), hafnium (Hf), zirconium (Zr), aluminum (Al), tantalum (Ta), germanium (Ge), zinc (Zn), gallium (Ga), tin (Sn), or indium (In), zinc oxide (ZnO), indium-gallium-zinc oxide (In-GaZnO4), indium zinc oxide (Zn—In—O), zinc-tin oxide (Zn—Sn—O), indium gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium gallium oxide (In—Ge—Ga—O), titanium-indium-zinc oxide (Ti—In—Zn—O), and hafnium-indium-zinc oxide (Hf—In—Zn—O), which are complex oxides thereof. In the case the semiconductor 130 is formed of an oxide semiconductor material, a separate passivation layer can be added for protecting the oxide semiconductor material which is vulnerable to external influences such as a high temperature.

The semiconductor 130 includes a channel which is doped with an N-type impurity or a P-type impurity, and a source doping part and a drain doping part which are formed at respective sides of the channel and doped with an opposite-type doping impurity compared to the doping impurity doped on the channel. In the exemplary embodiment, the source doping part and the drain doping part correspond to the source electrode and the drain electrode, respectively. The source electrode and the drain electrode formed in the semiconductor 130 can be formed by doping only the corresponding regions. Further, in the semiconductor 130, a region between source electrodes and drain electrodes of different transistors is doped, and thus the source electrode and the drain electrode can be electrically connected to each other.

As illustrated in FIG. 4, the channel 131 includes a driving channel 131a formed in the driving transistor T1, a switching channel 131b formed in the switching transistor T2, a compensation channel 131c formed in the compensation transistor T3, an initialization channel 131d formed in the initialization transistor T4, an operation control channel 131e formed in the operation control transistor T5, a light emission control channel 131f formed in the light emission control transistor T6, and a bypass channel 131g formed in the bypass transistor T7.

The driving transistor T1 includes the driving channel 131a, a driving gate electrode 155a, a driving source electrode 136a, and a driving drain electrode 137a. The driving channel 131a can be curved and can have a meandering shape or a zigzag shape. As such, by forming the curved driving channel 131a, the driving channel 131a can be formed to be elongated in a narrow space. Accordingly, a driving range of the driving gate-source voltage Vgs between the driving gate electrode 155a and the driving source electrode 136a is increased by the elongated driving channel 131a. Since the driving range of the gate voltage is increased, a gray scale of light emitted from the OLED OLD can be finely controlled by changing the magnitude of the gate voltage, and as a result, the resolution of the OLED display device can be enhanced and display quality can be improved. Various examples such as 'reverse S', 'S', 'M', and 'W' can be implemented by variously modifying the shape of the driving channel 131a.

The driving gate electrode 155a overlaps the driving channel 131a, and the driving source electrode 136a and the driving drain electrode 137a are formed at respective sides of the driving channel 131a to be close. The driving gate electrode 155a is connected to the first data connecting member (or first data connector) 174 through a contact hole 61.

The switching transistor T2 includes the switching channel 131b, a switching gate electrode 155b, a switching source electrode 136b, and a switching drain electrode 137b. The switching gate electrode 155b, which is a part extending downward from the scan line 121, overlaps the switching channel 131b, and the switching source electrode 136b and the switching drain electrode 137b are formed at respective sides of the switching channel 131b to be close thereto. The switching source electrode 136b is connected to the data line 171 through a contact hole 62.

The compensation transistor T3 includes the compensation channel 131c, a compensation gate electrode 155c, a compensation source electrode 136c, and a compensation drain electrode 137c. The compensation gate electrode 155c, which is a part of the scan line 151, is formed in two in order to prevent current leakage, and it overlaps the compensation channel 131c. The compensation source electrode 136c and the compensation drain electrode 137c are formed to be adjacent to respective sides of the compensation channel 131c. The compensation drain electrode 137c is connected to a driving connecting member (or driving connector) 174 through a contact hole 63.

The initialization transistor T4 includes the initialization channel 131d, an initialization gate electrode 155d, an initialization source electrode 136d, and an initialization drain electrode 137d. The initialization gate electrode 155d that is a part of the previous scan line 152 is formed in two in order to prevent current leakage, and it overlaps the initialization channel 131d. The initialization source electrode 136d and the initialization drain electrode 137d are formed to be adjacent to respective sides of the initialization channel 131d. The initialization source electrode 136d is connected to an initialization connecting member (or initialization connector) 175 through a contact hole 64.

The operation control transistor T5 includes the operation control channel 131e, an operation control gate electrode 155e, an operation control source electrode 136e, and an operation control drain electrode 137e. The operation control gate electrode 155e, which is a part of the light emission control line 153, overlaps the operation control channel 131e, and the operation control source electrode 136e and the operation control drain electrode 137e are formed to be adjacent to respective sides of the operation control channel 131e. The operation control source electrode 136e is connected to a driving voltage line 172 through a contact hole 65.

The light emission control transistor T6 includes the light emission control channel 131f, a light emission control gate electrode 155f, a light emission control source electrode 136f, and a light emission control drain electrode 137f. The light emission control gate electrode 155f, which is a part of the light emission control line 153, overlaps the light emission control channel 131f. The light emission control source electrode 136f and the light emission control drain electrode 137f are formed to be adjacent to respective sides of the light emission control channel 131f. The light emission control drain electrode 137f is connected to the third data connecting member (or third data connector) 179 through a contact hole 66.

The bypass transistor T7 includes the bypass channel 131g, a bypass gate electrode 155g, a bypass source electrode 136g, and a bypass drain electrode 137g. The bypass gate electrode 155g, which is a part of the bypass control line 158, overlaps the bypass channel 131g, and the bypass source electrode 136g and the bypass drain electrode 137g are formed to be adjacent to respective sides of the bypass channel 131g.

The bypass source electrode 136g is directly connected to the light emission control drain electrode 137f, and the bypass drain electrode 137g is directly connected to the initialization source electrode 136d.

One end of the driving channel 131a of the driving transistor T1 is connected to the switching drain electrode 137b and the operation control drain electrode 137e, and the other end of the driving channel 131a is connected to the compensation source electrode 136c and the light emission control source electrode 136f.

The first storage capacitor Cst1 includes a first lower storage electrode 155a and a first upper storage electrode 178 formed via an interlayer insulating layer 160 interposed therebetween. The first lower storage electrode 155a corresponds to the driving gate electrode 155a and the first upper storage electrode 178 is an expansion of the first driving voltage line 172a. Here, the gate insulating layer 160 becomes a dielectric material, and a storage capacitance is determined by a charge charged in the first storage capacitor Cst1 and a voltage between the electrodes 155a and 178. As described above, by using the driving gate electrode 155a as the first lower storage electrode 155a, a space for forming the first storage capacitor can be obtained in the space that is decreased by the driving channel 131a occupying a large area in the pixel.

The interlayer insulating layer 160 as the dielectric material of the first storage capacitor Cst1 has a thickness of about 4000 Å, which is thicker than the thickness of about 1300 Å of the gate insulating layer 140. Accordingly, the first storage capacitance is decreased compared to an 8 mask structure using the gate insulating layer 140 as the dielectric material.

However, in an exemplary embodiment of the present disclosure, to increase the storage capacitance, the second storage capacitor Cst2 is formed at a position separated from the first storage capacitor Cst1. The first storage capacitor Cst1 and the second storage capacitor Cst2 are formed inside an imaginary rectangular shape CP formed by crossing the plurality of scan lines 151 and the data lines 171.

The second storage capacitor Cst2 includes a second lower storage electrode 132 and a second upper storage electrode 154 formed via the gate insulating layer 140. The first lower storage electrode 155a has a substantially rectangular shape and is separated from the second upper storage electrode 154 by a predetermined interval dl. Here, the gate insulating layer 140 becomes a dielectric material and a second storage capacitance is determined by the charge charged in the second storage capacitor Cst2 and the voltage between both electrodes 132 and 154.

The first lower storage electrode 155a of the driving gate electrode 155a is connected to the second lower storage electrode 132 through the contact hole 69, and the second lower storage electrode 132 is connected to one end of the driving connecting member 174 through a storage groove 51 formed in the second upper storage electrode 154. Accordingly, a contact hole 61 for connecting one end of the driving connecting member 174 and the second lower storage electrode 132 is formed inside the storage groove 51.

The first upper storage electrode 178 is an expansion extending from the first driving voltage line 172a. Accordingly, the first storage capacitor Cst1 stores a first storage capacitance corresponding to a difference between the driving voltage ELVDD transmitted to the first upper storage electrode 178 through the driving voltage line 172 and the compensation voltage Dm+Vth transmitted to the first lower storage electrode 155a through the driving connecting member 174 and the second lower storage electrode 132. As described above, by forming the portion of the driving voltage line 172 as the second storage electrode 178, it is not necessary for the second storage electrode to be formed as a separate layer, and thus the number of masks used in manufacturing such can be reduced. In this case, a total of 7 masks are used from the semiconductor 130 to the common electrode 270, and this manufacturing method is referred to as a 7 mask process, while the structure of the OLED display manufactured by the 7 mask process is referred to as a 7 mask structure.

Also, the second lower storage electrode 132 is separated from the driving channel 131a on the plane and is positioned on the driving channel 131a. The second lower storage electrode 132 is connected to the driving connecting member 174 through the contact hole 61. The driving connecting member 174 is formed in the same layer as the data line 171 to be substantially parallel and the other end of the driving connecting member 174 is connected to the compensation drain electrode 137c of the compensation transistor T3 through the contact hole 63 and the initialization drain electrode 137d of the initialization transistor T4. Accordingly, the driving connecting member 174 connects the driving gate electrode 155a, the compensation drain electrode 137c of the compensation transistor T3, and the initialization drain electrode 137d of the initialization transistor T4 to each other.

Also, the second upper storage electrode 154 is connected to the initialization connecting member 175 through the contact hole 67, and the initialization connecting member 175 is connected to the initialization voltage line 192 through the contact hole 82.

The second lower storage electrode 132 is formed of the semiconductor 130 and overlaps the second upper storage electrode 154 such that it is not doped with the doping impurity on the channel doping. In this case, when the initialization voltage Vint transmitted to the second upper storage electrode 154 through the initialization voltage line 192 has a predetermined negative (−) voltage, the second lower storage electrode 132 can be used as the conductor.

Figure 8:
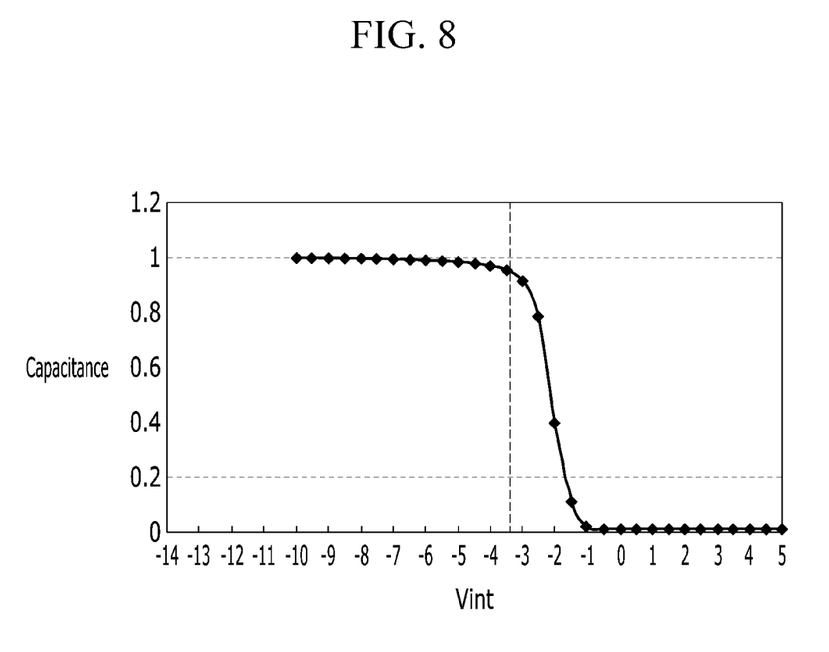
FIG. 8 is a graph of a second storage capacitance depending on an initialization voltage applied to a second storage capacitor of an OLED display according to an exemplary embodiment of the present disclosure.

FIG. 8 is a graph showing a second storage capacitance depending on an initialization voltage applied to a second storage capacitor of an OLED display according to an exemplary embodiment of the present disclosure.

As shown in FIG. 8, when the initialization voltage Vint reaches about −3.5V, it can be confirmed that the second lower storage electrode 132 becomes the conductor, such that the second storage capacitance has a predetermined value.

As described above, the second storage capacitor Cst2 stores the second storage capacitance corresponding to the difference between the initialization voltage Vint transmitted to the second upper storage electrode 132 through the initialization voltage line 192 and the compensation voltage Dm+Vth transmitted to the second lower storage electrode 154 through the driving connecting member 174. For example, since the gate insulating layer 140 with the thickness lower than the interlayer insulating layer 160 is used as the dielectric material of the second storage capacitor Cst2, when it is assumed that the plane area of the second storage capacitor Cst2 is the same as the plane area of the first storage capacitor Cst1, the second storage capacitance of the second storage capacitor Cst2 is larger than the first storage capacitance of the first storage capacitor Cst1. Accordingly, the total storage capacitance of one pixel is maximized.

As described above, by forming the first storage capacitor Cst1 and the second storage capacitor Cst2 in one pixel, the storage capacitance can be maximized.

The data line 171 crosses the scan line 151 and extends in the column direction, and the driving voltage line 172 is separated from the data line 171 and extends in the column direction.

The light emission control connecting member (or light emission control connector) 179 having a substantially rectangular shape is connected to the pixel electrode 191 through the contact hole 81, and the initialization connecting member 175 is connected to the initialization voltage line 192 through the contact hole 82.

Hereinafter, the section structure of the OLED display according to the exemplary embodiment of the present disclosure will be described in detail according to the stacked order with reference to FIG. 5, FIG. 6, and FIG. 7.

In this case, the operation control transistor T5 is substantially the same as the stacked structure of the light emission control transistor T6 and therefore a detailed description thereof will be omitted.

A buffer layer 120 is formed on the substrate 110. The substrate 110 can be formed as an insulating substrate, which is formed of glass, quartz, ceramic, plastic, or the like. The buffer layer 120 serves to block impurities from the substrate 110 in order to improve characteristics of polysilicon at the time of the crystallization process for forming polysilicon and planarizing the substrate 110 to mitigate stress of the semiconductor formed on the buffer layer 120. The buffer layer 120 can be formed of silicon nitride (SiNx), silicon oxide (SiO2), or the like.

A semiconductor 130 that includes a channel 131 including a driving channel 131a, a switching channel 131b, a compensation channel 131c, an initialization channel 131d, an operation control channel 131e, a light emission control channel 131f, and a bypass channel 131g, and a semiconductor 130 that includes a second lower storage electrode 132 are formed on the buffer layer 120. The driving source electrode 136a and the driving drain electrode 137a are formed at both sides of the driving channel 131a of the semiconductor 130 and the switching source electrode 136b, and the switching drain electrode 137b is formed at both sides of the switching channel 131b. Further, the compensation source electrode 136c and the compensation drain electrode 137c are formed at both sides of the compensation channel 131c and the initialization source electrode 136d, and the initialization drain electrode 137d is formed at both sides of the initialization channel 131d. Further, the operation control source electrode 136e and the operation control drain electrode 137e are formed at both sides of the operation control channel 131e and the light emission control source electrode 136f, and the light emission control drain electrode 137f is formed at both sides of the light emission control channel 131f. The bypass source electrode 136g and the bypass drain electrode 137g are formed at both sides of the bypass channel 131g.

A gate insulating layer 140 covering the semiconductor 130 is formed thereon. Gate metal lines 151, 152, 153, 158, 155a, and 154, which include a scan line 151 including a switching gate electrode 155b and a compensation gate electrode 155c, a previous scan line 152 including an initialization gate electrode 155d, a light emission control line 153 including an operation control gate electrode 155e and a light emission control gate electrode 155f, a bypass control line 158 including a bypass gate electrode 155g, a driving gate electrode (a first lower storage electrode) 155a, and a second upper storage electrode 154, are formed on the gate insulating layer 140. The gate metal lines 151, 152, 153, 158, 155a, and 154 can be formed in multiple layers in which metal layers formed of any one of copper (Cu), copper alloy, aluminum (Al), aluminum alloy, molybdenum (Mo), and molybdenum alloy are stacked.

An interlayer insulating layer 160 covering the gate metal layers 151, 152, 153, 158, 155a, and 154, and the gate insulating layer 140 is formed thereon. The interlayer insulating layer 160 can be formed of silicon nitride (SiNx) or silicon oxide (SiO2).

The interlayer insulating layer 160 has contact holes 61, 62, 63, 64, 65, 66, 67, 68, and 69. Metal data lines 171, 172, 174, 175, 176, and 179, which include a data line 171, a driving voltage line 172 including a first upper storage electrode 178, a driving connecting member 174, an initialization connecting member 175, a storage connecting member (or storage connector) 176, and a light emission control connecting member 179, are formed on the interlayer insulating layer 160. The metal data lines 171, 172, 174, 175, 176, and 179 can be formed in multiple layers, in which metal layers formed of any one of copper (Cu), copper alloy, aluminum (Al), aluminum alloy, molybdenum (Mo), and molybdenum alloy are stacked, and for example, can be formed of a triple layer of titanium/aluminum/titanium (Ti/Al/Ti), molybdenum/aluminum/molybdenum (Mo/Al/Mo), molybdenum/copper/molybdenum (Mo/Cu/Mo), or the like.

The data line 171 is connected to the switching source electrode 136b through the contact hole 62 formed in the gate insulating layer 140 and the interlayer insulating layer 160, and the first driving voltage line 172a partially extends to form a first upper storage electrode 178.

One end of the driving connecting member 174 is connected to the second lower storage electrode 132 through the contact hole 61 formed in the interlayer insulating layer 160, and the other end of the driving connecting member 174 is connected to the compensation drain electrode 137c and the initialization drain electrode 137d through the contact hole 63 formed in the gate insulating layer 140 and the interlayer insulating layer 160.

One end of the initialization connecting member 175 is connected to the initialization source electrode 136d through the contact hole 64 formed in the gate insulating layer 140 and the interlayer insulating layer 160, and the other end of the initialization connecting member 175 is connected to the second upper storage electrode 154 through the contact hole 67 formed in the interlayer insulating layer 160.

The storage connecting member 176 connects the second lower storage electrode 132 and the first lower storage electrode 155a to each other through the contact hole 67 formed in the gate insulating layer 140 and the interlayer insulating layer 160. Accordingly, the second lower storage electrode 132 and the first lower storage electrode 155a are applied with the compensation voltage Dm+Vth through the driving connecting member 174.

Also, the light emission control connecting member 179 is connected to the light emission drain electrode 137f through the contact hole 66 formed in the gate insulating layer 140 and the interlayer insulating layer 160.

A passivation layer 180 is formed on the metal data lines 171, 172, 174, 175, 176, and 179 and the interlayer insulating layer 160. The passivation layer 180 covers the metal data lines 171, 172, 174, 175, 176, and 179 to flatten them, such that the pixel electrode 191 can be formed on the passivation layer 180 without a step. The passivation layer 180 can be formed of a stacked layer of an organic material, such as polyacrylates resin, polyimides resin, or the like, or a stacked layer of an organic material and an inorganic material.

The pixel electrode 191 and an initialization voltage line 192 are formed on the passivation layer 180. The light emission control connecting member 179 is connected to the pixel electrode 191 through the contact hole 81 formed in the passivation layer 180, and the initialization connecting member 175 is connected to the initialization voltage line 192 through the contact hole 82 formed in the passivation layer 180.

A pixel definition layer (PDL) 350 covering the passivation layer 180, the initialization voltage line 192, and the edge of the pixel electrode 191 is formed thereon, and the pixel definition layer 350 has a pixel opening 351 exposing the pixel electrode 191. The pixel definition layer 350 can be formed of organic materials such as polyacrylates resin, polyimides resin, and the like, and silica-based organic materials.

An organic emission layer 370 is formed on the pixel electrode 191 exposed through the pixel opening 351 and a common electrode 270 is formed on the organic emission layer 370. The common electrode 270 is also formed on the pixel definition layer 350 over the pixels PX. As such, the OLED (OLD) including the pixel electrode 191, the organic emission layer 370, and the common electrode 270 is formed.

Here, the pixel electrode 191 is an anode, which is a hole injection electrode, and the common electrode 270 is a cathode, which is an electron injection electrode. However, the exemplary embodiment according to the present disclosure is not necessarily limited thereto, and the pixel electrode 191 can be the cathode and the common electrode 270 can be the anode according to a driving method of the foldable display device. Holes and electrons are injected into the organic emission layer 370 from the pixel electrode 191 and the common electrode 270, respectively, and excitons acquired by combining the injected holes and electrons fall from an excitation state to a ground state.

The organic emission layer 370 is formed of a low-molecular organic material or a high-molecular organic material such as poly(3,4-ethylenedioxythiophene) (PEDOT). Further, the organic emission layer 370 can be formed with multiple layers, including at least one of an emission layer, a hole injection layer (HIL), a hole transporting layer (HTL), an electron transporting layer (ETL), and an electron injection layer (EIL). When the organic emission layer 370 includes all of the layers, the hole injection layer is formed on the pixel electrode 191, which is the positive electrode, and the hole transporting layer, the light emission layer, the electron transporting layer, and the electron injection layer are sequentially laminated thereon.

The organic emission layer 370 can include a red organic emission layer emitting red light, a green organic emission layer emitting green light, and a blue organic emission layer emitting blue light, and the red organic emission layer, the green organic emission layer, and the blue organic emission layer are formed at a red pixel, a green pixel, and a blue pixel, respectively, to implement color images.

Further, in the organic emission layer 370, all of the red organic emission layer, the green organic emission layer, and the blue organic emission layer are laminated together on the red pixel, the green pixel, and the blue pixel, and a red color filter, a green color filter, and a blue color filter are formed for each pixel to implement the color images. As another example, a white organic emission layer emitting white light is formed on all of the red pixel, the green pixel, and the blue pixel, and the red color filter, the green color filter, and the blue color filter are formed for each pixel to implement the color images. When the color images are implemented by using the white organic emission layer and the color filters, a deposition mask for depositing the red organic emission layer, the green organic emission layer, and the blue organic emission layer on individual pixels, i.e., the red pixel, the green pixel, and the blue pixel, may not be necessary.

The white organic emission layer described in another example can, of course, be formed by one organic emission layer, and even includes a configuration that can emit white light by laminating a plurality of organic emission layers. As an example, the white organic emission layer includes a configuration that enables the white light to be emitted by combining at least one yellow organic emission layer and at least one blue organic emission layer, a configuration that enables the white light to be emitted by combining at least one cyan organic emission layer and at least one red organic emission layer, a configuration that enables the white light to be emitted by combining at least one magenta organic emission layer and at least one green organic emission layer, and the like.

An encapsulation member (or encapsulator; not shown) protecting the OLED OLD can be formed on the common electrode 270, and the encapsulation member can be sealed to the substrate 110 by a sealant and can be formed of various materials, such as glass, quartz, ceramic, plastic, and a metal. On the other hand, a thin film encapsulation layer can be formed on the common electrode 270 by depositing the inorganic layer and the organic layer with the usage of the sealant.

While the inventive technology has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. An organic light-emitting diode (OLED) display, comprising:
   a substrate;
   a scan line formed over the substrate and configured to provide a scan signal;
   a data line crossing the scan line and configured to provide a data voltage;
   a driving voltage line crossing the scan line and configured to provide a driving voltage;
   a switching transistor electrically connected to the scan line and the data line;
   a driving transistor electrically connected to the switching transistor and including a driving gate electrode and a driving channel overlapping each other in a depth dimension of the OLED display;
   a first storage capacitor overlapping the driving channel in the depth dimension and including a first lower storage electrode and a portion of the driving voltage line;
   a second storage capacitor separated from the first storage capacitor, overlapping the portion of the driving voltage line in the depth dimension, and including a second lower storage electrode and a second upper storage electrode overlapping the second lower storage electrode in the depth dimension, wherein the second upper storage electrode is formed on the same layer as the first lower storage electrode; and
   an OLED electrically connected to the driving transistor.

2. The OLED display of claim 1, wherein the first lower storage electrode includes the driving gate electrode, and the first storage capacitor includes a first upper storage electrode overlapping the first lower storage electrode and including the portion of the driving voltage line.

3. The OLED display of claim 2, wherein the second lower storage electrode is formed on the same layer as the driving channel.

4. The OLED display of claim 3, wherein the first lower storage electrode and the second upper storage electrode are separated from each other.

5. The OLED display of claim 3, wherein the first lower storage electrode is formed on the same layer as the scan line.

6. The OLED display of claim 5, further comprising a storage connector formed on the same layer as the driving voltage line and configured to electrically connect the first lower storage electrode to the second lower storage electrode.

7. The OLED display of claim 6, wherein the OLED includes a pixel electrode electrically connected to the driving transistor, an organic emission layer formed over the pixel electrode, and a common electrode formed over the organic emission layer, and wherein the OLED display further comprises:
   an initialization voltage line formed on the same layer as the pixel electrode and configured to provide an initialization voltage to initialize the driving transistor; and
   an initialization connector configured to electrically connect the initialization voltage line to the second upper storage electrode.

8. The OLED display of claim 7, further comprising:
   a gate insulating layer formed over the substrate; and
   an interlayer insulating layer at least partially covering the first lower storage electrode and the second upper storage electrode formed over the gate insulating layer, wherein the storage connector and the initialization connector are formed over the interlayer insulating layer.

9. The OLED display of claim 7, wherein the storage connector has a contact hole configured to electrically connect the first lower storage electrode to the second lower storage electrode.

10. The OLED display of claim 8, wherein the gate insulating layer is thinner than the interlayer insulating layer.

11. The OLED display of claim 1, wherein the driving channel is formed over the substrate, and wherein the driving channel is non-linear.

12. The OLED display of claim 1, wherein the driving voltage line includes i) a first driving voltage line substantially parallel to the data line and ii) a second driving voltage line crossing the data line, wherein the first driving voltage line is formed on the same layer as the data line, and wherein the second driving voltage line is formed on the same layer as the scan line.

13. The OLED display of claim 1, wherein the first and second storage capacitors are spaced apart from each other within a pixel of the OLED display.

14. The OLED display of claim 1, wherein the driving transistor further includes a driving source electrode and a driving drain electrode located at opposing ends of the driving channel.

15. The OLED display of claim 14, further comprising:
a compensation transistor electrically connected to the driving drain electrode and configured to be turned on based on a scan signal so as to compensate a threshold voltage of the driving transistor; and
a driving connector configured to electrically connect a compensation drain electrode of the compensation transistor to the driving gate electrode.

16. An organic light-emitting diode (OLED) display comprising:
a substrate;
a data line formed over the substrate and configured to provide a data voltage;
a driving voltage line formed adjacent to the data line and configured to provide a driving voltage;
a first storage capacitor including a first upper storage electrode, wherein a portion of the driving voltage line is the first upper storage electrode; and
a second storage capacitor electrically separated from the first storage capacitor and overlapping the portion of the driving voltage line in a depth dimension of the OLED display.

17. The OLED display of claim 16, further comprising a driving transistor including a driving gate electrode and a driving channel overlapping each other in the depth dimension, wherein the first storage capacitor overlaps the driving channel in the depth dimension.

18. The OLED display of claim 17, wherein the first storage capacitor further includes a first lower storage electrode including the driving gate electrode, and wherein the second storage capacitor includes i) a second lower storage electrode formed on the same layer as the driving channel and ii) a second upper storage electrode overlapping the second lower storage electrode in the depth dimension and formed on the same layer as the first lower storage electrode.

19. The OLED display of claim 18, further comprising an OLED including a pixel electrode formed over the first upper and lower storage electrodes and the second upper and lower storage electrodes.

20. The OLED display of claim 19, wherein the first and second storage capacitors partially overlap each other.

* * * * *